US006801825B2

(12) United States Patent
Utsunomiya

(10) Patent No.: US 6,801,825 B2
(45) Date of Patent: Oct. 5, 2004

(54) MANAGEMENT SYSTEM AND MANAGEMENT METHOD OF SEMICONDUCTOR EXPOSURE APPARATUSES

(75) Inventor: Norihiko Utsunomiya, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/190,714

(22) Filed: Jul. 9, 2002

(65) Prior Publication Data

US 2003/0037309 A1 Feb. 20, 2003

(30) Foreign Application Priority Data

Jul. 13, 2001  (JP) ...................................... 2001-214345

(51) Int. Cl.$^7$ .............................................. G06F 19/00
(52) U.S. Cl. ...................... 700/121; 700/95; 700/120; 716/21
(58) Field of Search ......................... 700/95, 120, 121; 716/21

(56) References Cited

U.S. PATENT DOCUMENTS

| | | | | |
|---|---|---|---|---|
| 6,142,660 A | | 11/2000 | Utsunomiya et al. | 364/468.28 |
| 6,225,011 B1 | * | 5/2001 | Gotoh et al. | 430/22 |
| 6,277,532 B1 | * | 8/2001 | Yahiro | 430/30 |
| 6,337,162 B1 | * | 1/2002 | Irie | 430/5 |

* cited by examiner

Primary Examiner—Leo Picard
Assistant Examiner—Charles Kasenge
(74) Attorney, Agent, or Firm—Fitzpatrick, Cella, Harper & Scinto

(57) ABSTRACT

A management system including a plurality of semiconductor exposure apparatuses is provided for controlling various exposures in manufacturing a semiconductor device. When plural numbers of times of exposure are performed, the management system determines a combination of semiconductor exposure apparatuses having the most appropriate exposure condition for each number of times of exposure based on a distortion generated in the semiconductor exposure apparatus.

13 Claims, 18 Drawing Sheets

FIG. 3A

| RETICLE ID | MEASUREMENT COORDINATE ID | X COORDINATE | Y COORDINATE |
|---|---|---|---|
| A00001 | 1 | 0.003 | −0.002 |
| A00001 | 2 | 0.007 | 0.012 |
| A00001 | 3 | −0.004 | 0.006 |
| A00001 | 4 | 0.005 | −0.002 |
| A00001 | 5 | 0.004 | −0.005 |
| A00001 | 6 | 0.001 | −0.001 |
| A00001 | 7 | 0.006 | −0.003 |
| A00001 | 8 | −0.005 | −0.002 |
| A00001 | 9 | 0.000 | 0.003 |
| A00002 | 1 | 0.003 | −0.002 |
| A00002 | 2 | 0.007 | 0.012 |
| A00002 | 3 | −0.004 | 0.006 |
| A00002 | 4 | 0.005 | −0.002 |
| A00002 | 5 | 0.004 | −0.005 |
| A00002 | 6 | 0.001 | −0.001 |
| A00002 | 7 | 0.006 | −0.003 |
| A00002 | 8 | −0.005 | −0.002 |
| A00002 | 9 | 0.000 | 0.003 |

FIG. 3B

| MEASUREMENT COORDINATE ID | X COORDINATE | Y COORDINATE |
|---|---|---|
| 1 | −10.1 | 10.1 |
| 2 | 0.00 | 10.1 |
| 3 | 10.1 | 10.1 |
| 4 | −10.1 | 0.00 |
| 5 | 0.00 | 0.00 |
| 6 | 10.1 | 0.00 |
| 7 | −10.1 | −10.1 |
| 8 | 0.00 | −10.1 |
| 9 | 10.1 | −10.1 |

FIG. 3C

| APPARATUS ID | MEASUREMENT DATE | RETICLE ID | ILLUMINATION NA | ILLUMINATION Sigma | MEASUREMENT COORDINATE ID | X MEASUREMENT VALUE | Y MEASUREMENT VALUE |
|---|---|---|---|---|---|---|---|
| STP001 | 1998/02/02 10:22:22 | A0001 | 0.63 | 0.65 | 1 | 0.011 | −0.008 |
| STP001 | 1998/02/02 10:22:22 | A0001 | 0.63 | 0.65 | 2 | −0.008 | −0.007 |
| STP001 | 1998/02/02 10:22:22 | A0001 | 0.63 | 0.65 | 3 | 0.005 | −0.013 |
| STP001 | 1998/02/02 10:22:22 | A0001 | 0.63 | 0.65 | 4 | −0.005 | 0.006 |
| STP001 | 1998/02/02 10:22:22 | A0001 | 0.63 | 0.65 | 5 | 0.002 | 0.005 |
| STP001 | 1998/02/02 10:22:22 | A0001 | 0.63 | 0.65 | 6 | 0.009 | 0.007 |
| STP001 | 1998/02/02 10:22:22 | A0001 | 0.63 | 0.65 | 7 | −0.008 | 0.009 |
| STP001 | 1998/02/02 10:22:22 | A0001 | 0.63 | 0.65 | 8 | 0.010 | −0.008 |
| STP001 | 1998/02/02 10:22:22 | A0001 | 0.63 | 0.65 | 9 | 0.007 | 0.002 |
| STP002 | 1998/02/03 12:14:12 | A0002 | 0.63 | 0.65 | 1 | 0.001 | 0.001 |
| STP002 | 1998/02/03 12:14:12 | A0002 | 0.63 | 0.65 | 2 | −0.004 | 0.005 |
| STP002 | 1998/02/03 12:14:12 | A0002 | 0.63 | 0.65 | 3 | 0.005 | 0.007 |

FIG. 4

| PRODUCT ID | PROCESS ID | PROCESS SEQUENCE NUMBER | ALIGNMENT TARGET LAYER | PROCESSING ILLUMINATION NA | PROCESSING ILLUMINATION Sigma | PERMISSIBLE ERROR X[um] | PERMISSIBLE ERROR Y[um] |
|---|---|---|---|---|---|---|---|
| DR64001 | CH64-1A | 0 | N/A | 0.63 | 0.65 | N/A | N/A |
| DR64001 | CH64-2A | 1 | CH64-1A | 0.55 | 0.65 | 0.070 | 0.070 |
| DR64001 | CH64-3A | 2 | CH64-1A | 0.63 | 0.65 | 0.120 | 0.120 |
| DR64001 | CH64-4A | 3 | CH64-1A | 0.55 | 0.65 | 0.120 | 0.120 |
| DR64001 | CH64-5A | 4 | CH64-4A | 0.63 | 0.65 | 0.070 | 0.070 |
| DR64001 | CH64-6A | 5 | CH64-4A | 0.55 | 0.65 | 0.120 | 0.120 |
| DR64001 | CH64-7A | 6 | CH64-4A | 0.63 | 0.65 | 0.120 | 0.120 |
| DR64001 | CH64-8A | 7 | CH64-4A | 0.55 | 0.65 | 0.070 | 0.070 |
| DR64001 | CH64-9A | 8 | CH64-8A | 0.63 | 0.65 | 0.140 | 0.140 |
| DR64001 | CH64-10A | 9 | CH64-8A | 0.55 | 0.65 | 0.070 | 0.070 |

FIG. 10

| | 1001 | 1002 | 1003 | |
|---|---|---|---|---|
| REFERENCE PROCESS INPUT | | | | |

PRODUCT ID  [DR64001]   [SELECT]

| PROCESS ID | PROCESS SEQUENCE NUMBER | ALIGNMENT TARGET LAYER |
|---|---|---|
| CH64-1A | 0 | N/A |
| CH64-2A | 1 | CH64-1A |
| CH64-3A | 2 | CH64-1A |
| CH64-4A | 3 | CH64-1A |
| CH64-5A | 4 | CH64-4A |
| CH64-6A | 5 | CH64-4A |
| CH64-7A | 6 | CH64-4A |
| CH64-8A | 7 | CH64-4A |
| CH64-9A | 8 | CH64-8A |
| CH64-10A | 9 | CH64-8A |

1004

1005 / 1006 / 1007

LINEAR CORRECTION
● YES     ○ NO

1008

[START SEARCH]    [CANCEL]

1009        1010

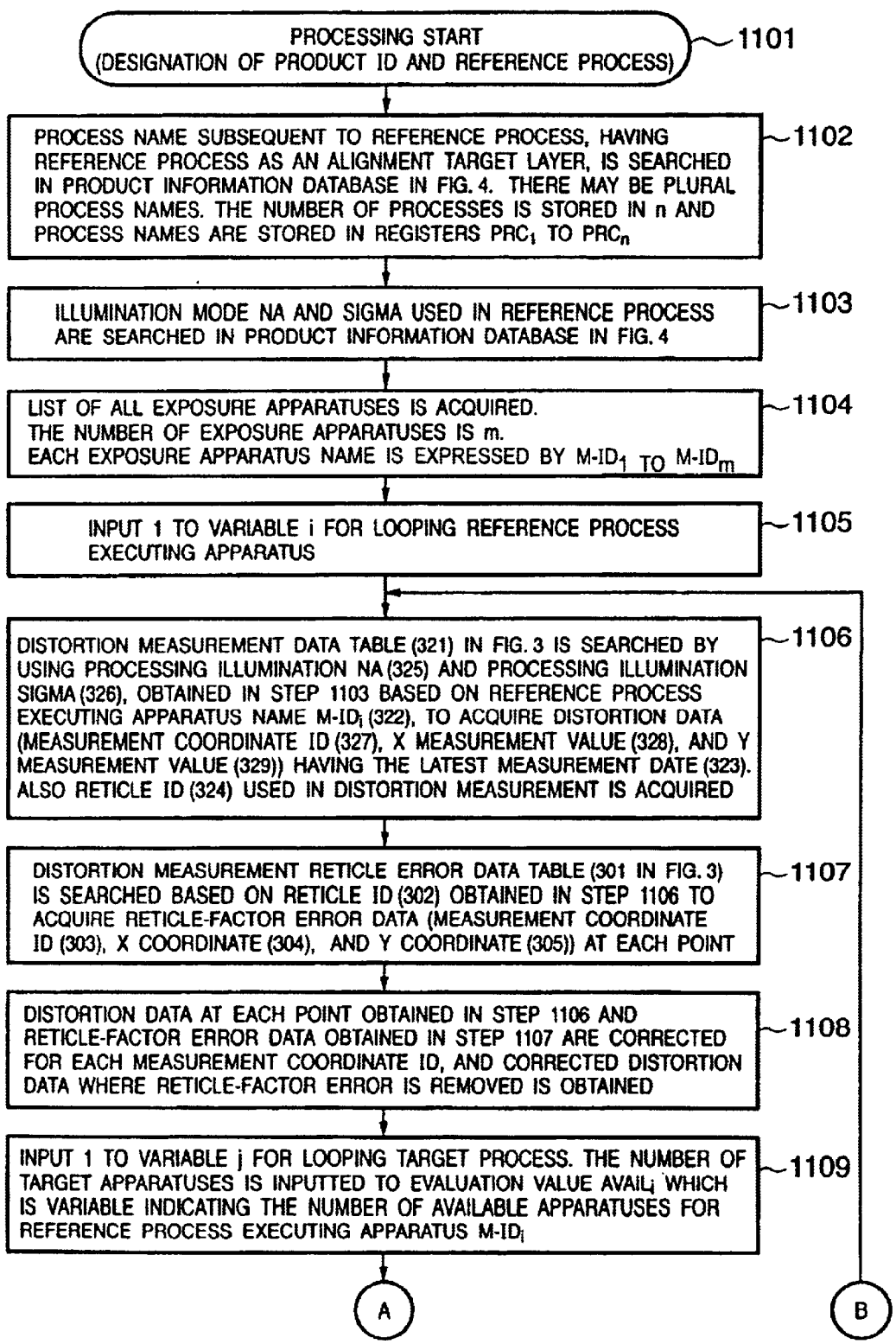

REFERENCE PROCESS EXECUTING APPARATUS LIST

| PRODUCT ID | DR64001 | ~1402 |
| REFERENCE PROCESS | CH64-4A | ~1403 |
| CORRECTION MODE | YES | ~1404 |

| DETERMINATION ORDER | APPARATUS ID | EVALUATION VALUE |
|---|---|---|
| 1 | STP003 | 8 |
| 2 | STP005 | 6 |
| 3 | STP007 | 5 |
| 4 | STP006 | 4 |
| 5 | STP001 | 3 |
| 6 | STP010 | 2 |
| 7 | STP009 | 2 |
| 8 | STP002 | 1 |
| 9 | STP004 | 1 |
| 10 | STP008 | 1 |

1406　1407　1408　1405

1409
CLOSE

MANAGEMENT SYSTEM AND MANAGEMENT METHOD OF SEMICONDUCTOR EXPOSURE APPARATUSES

FIELD OF THE INVENTION

The present invention relates to a management system of semiconductor exposure apparatuses exposing a circuit pattern on a wafer, and a semiconductor exposure apparatus management method which assures flexibility in selecting a semiconductor exposure apparatus while taking into consideration an alignment error of a product caused by a distortion of a semiconductor exposure apparatus.

BACKGROUND OF THE INVENTION

Conventionally, reduction of alignment errors caused by lens distortions of semiconductor exposure apparatuses has been attempted by engineers in a semiconductor manufacturing line, who control measurement results of a lens distortion of each semiconductor exposure apparatus, select exposure apparatuses having a close distortion trend, and designate the exposure apparatuses for each product or process.

When semiconductor exposure apparatuses are operated in the foregoing manner, there may be a case of inefficient operation, e.g., concentration of a processing lot to a particular apparatus. Furthermore, there is a problem of the increased number of management processes performed by engineers in a manufacturing line, considering the matching of distortions, including a distortion difference for each exposure illumination mode and a permissible error for each process.

SUMMARY OF THE INVENTION

The present invention has been proposed in view of the conventional problems, and has as its object to provide a management system and method of semiconductor exposure apparatuses, which can efficiently reduce an alignment error caused by distortions without increasing the number of processes and perform reliable exposure, by managing the system to select a combination of semiconductor exposure apparatuses which automatically perform the most appropriate exposure in accordance with each distortion caused by various conditions of semiconductor exposure apparatuses.

According to the present invention, the foregoing object is attained by providing a semiconductor exposure apparatus management system for controlling each of a plurality of semiconductor exposure apparatuses for each exposure process when the plurality of semiconductor exposure apparatuses are used to execute a plurality of expos re processes and manufacture a semiconductor device, the system comprising:

management means for managing distortion data corresponding to an exposure condition of each exposure process for each of the semiconductor exposure apparatuse designation means for designating an arbitrary exposure process in the plurality of exposure processes;

search means for searching the plurality of exposure processes for an exposure process whose alignment target is the exposure process designated by said designation means;

first data acquisition means for acquiring first distortion data for each of the semiconductor exposure apparatuses, the first distortion data corresponding to an exposure condition of the exposure process designated by said designation means;

second data acquisition means for acquiring second distortion data for each of the semiconductor exposure apparatuses, the second distortion data corresponding to an exposure condition of the exposure process searched by said search means; and calculation means for calculating a distortion-factor alignment error for each combination of a semiconductor exposure apparatus which causes to execute the exposure process designated by said designation means and a semiconductor exposure apparatus which causes to execute the exposure process searched by said search means, based on the first distortion data and the second distortion data.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 3A, 3B and 3C are schematic views showing a management method of distortion data;

FIG. 4 is a schematic view showing a management method of product information;

FIG. 10 is a schematic view showing a screen for inputting a reference process;

FIG. 11 is a flowchart showing a semiconductor exposure apparatus management method;

FIG. 15 is a schematic view showing a screen displaying a list of reference process executing apparatuses.

DETAILED DESCRIPTION OF THE PREFERRED EMBODIMENTS

Preferred embodiments of the present invention will now be described in detail in accordance with the accompanying drawings.

According to the present invention, when a semiconductor device is manufactured by using a plurality of semiconductor exposure apparatuses, a management system connected to the semiconductor exposure apparatuses through an online function or a network independent of the online function is constructed in order to compare a difference in distortions of the plurality of semiconductor exposure apparatuses. The management system performs data management of the plurality of semiconductor exposure apparatuses as well as calculation of the data among the plurality of semiconductor exposure apparatuses. Particularly used are distortion data managing a lens distortion of each semiconductor exposure apparatus, and product information managing an alignment tree of products and permissible errors for each process. Based on these two data, each of the distortions of the semiconductor exposure apparatuses with an illumination condition in a reference process is compared with each of the distortions of the semiconductor exposure apparatuses in a post process to obtain a distortion-factor alignment error. Then, the number of exposure apparatuses whose alignment error is within a permissible error is obtained. Based on this number of exposure apparatuses, flexibility of apparatus operation is determined.

Figure 1:
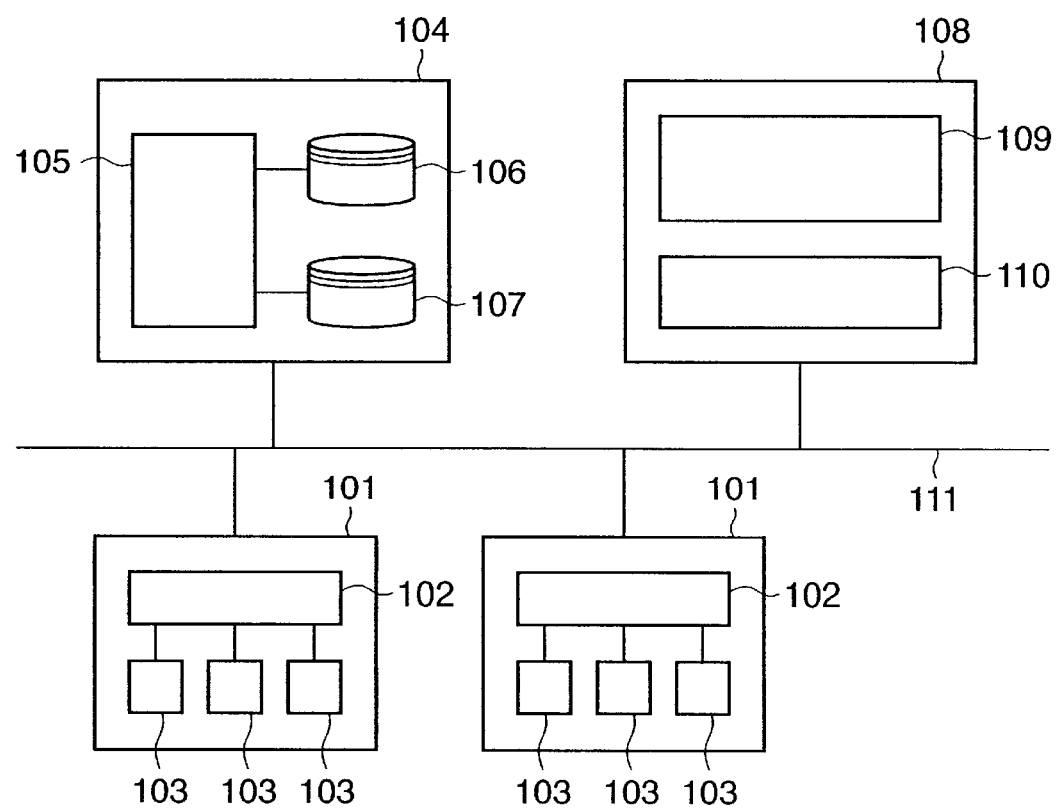
FIG. 1 is a schematic view showing an entire configuration of a semiconductor exposure apparatus management system.

FIG. 1 is a schematic view showing an entire configuration of a semiconductor exposure apparatus management system according to this embodiment.

Referring to FIG. 1, reference numeral 101 denotes a semiconductor exposure apparatus; 102, a console computer of the semiconductor exposure apparatus 101, which is normally called a console; 103, a control computer called a main sequence; and 104, a server computer of the semiconductor exposure apparatus management system. In the server computer 104 (hereinafter referred to as a server), reference numeral 105 denotes a database management system managing a distortion management database 106 and a product information database 107. In this embodiment, although the information is managed by the database management system 105, a regular file system included in the server 104 may be employed to perform data management in place of the database management system 105.

Reference numeral 108 denotes a client computer (hereinafter referred to as a client) of the semiconductor alignment management system. A user interface unit 109 and a data processor 110 are operating in the client 108.

Reference numeral 111 denotes a network of a semiconductor manufacturing factory. The semiconductor exposure apparatus 101, server 104, and client 108 are connected to the network to enable intercommunication.

Note that each of the server 104, client 108, console computer 102 and control computer 103 of the semiconductor exposure apparatus 101 comprises standard components that are included in a multipurpose computer (e.g., CPU, RAM, ROM, a hard disk, an external storage device, a network interface unit, a display, a keyboard, a mouse and so on).

Figure 2:
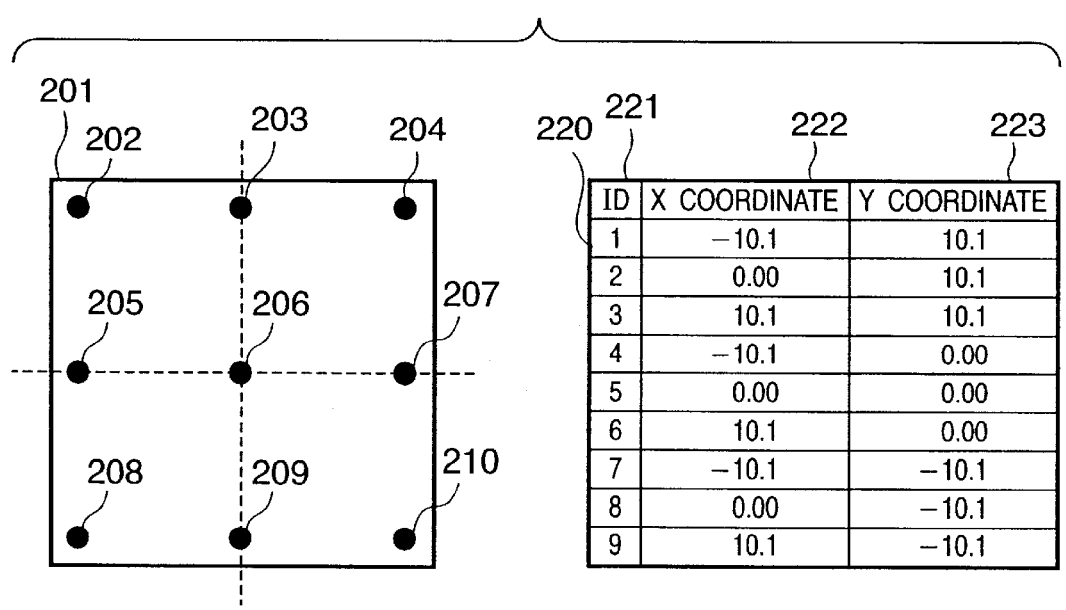
FIG. 2 is a schematic view showing measured coordinates of each distortion.

Herein, assume that a measurement pattern of distortions managed by this embodiment is the pattern of nine points (3×3) as shown in FIG. 2, and that measured coordinates are shown in the measurement coordinate table 220 in FIG. 2. The frame 201 indicates an exposure area of the semiconductor exposure apparatus 101, and plots 202 to 210 in the frame 201 indicate measurement points. Coordinates of the measurement point for each plot are shown in the measurement coordinate table 220.

In the table, reference numeral 221 denotes a measurement point ID which uniquely identifies the measurement point. Reference numeral 222 denotes an X coordinate of the measurement point corresponding to the ID; and 223, a Y coordinate of the measurement point. The measurement point 202 corresponds to ID 1; 203 corresponds to ID 2; 204 corresponds to ID 3; 205 corresponds to ID 4; 206 corresponds to ID 5; 207 corresponds to ID 6; 208 corresponds to ID 7; 209 corresponds to ID 8; and 210 corresponds to ID 9. In this embodiment, X and Y error components in these nine points are used as the distortion.

An example of the distortion management database 106 is shown in FIGS. 3A, 3B and 3C. The distortion management database is largely divided into three tables.

Reference numeral 301 denotes a distortion measurement reticle error data table showing a drawing error of a reticle used in distortion measurement. Reference numeral 302 denotes a reticle identification (ID) which uniquely identifies a reticle; 303, a measurement coordinate ID which indicates the ID having the coordinates of the same ID shown in FIG. 2; 304, a reticle drawing error in the X direction (X coordinate) which corresponds to the reticle ID and measurement coordinate 1; and 305, a reticle drawing error in the Y direction (Y coordinate). In this example, there are data corresponding to nine measurement points, as indicated by reference numeral 306, for one sheet of reticle. Although the distortion measurement reticle error data table 301 shows data for two sheets of reticles, in reality, there are numbers of data corresponding to the number of sheets of reticle used in the distortion measurement.

Reference numeral 311 denotes a distortion measurement coordinate table associating distortion measurement coordinates with the measurement point ID, which is similar to the measurement coordinate table 220 shown in FIG. 2. Reference numeral 312 denotes a measurement coordinate ID; 313, an X coordinate corresponding to the measurement coordinate ID; and 314, a Y coordinate.

Reference numeral 321 denotes a distortion measurement data table storing a measured value corresponding to each measurement point ID; 322, an apparatus ID which uniquely identifies a semiconductor exposure apparatus 101; and 323, a date of distortion measurement. Since this embodiment uses only the latest distortion data and does not particularly use the measurement date, a management method without a measurement date may be adopted. Reference numeral 324 denotes an identification of a reticle used in measurement. Reference numerals 325 and 326 denote an illumination mode (illumination condition) of a measured distortion, 325 indicating a numerical aperture (NA) of an illumination system of the semiconductor exposure apparatus 102 and 326 indicating a Sigma representing a ratio of the NA of the illumination system of the semiconductor exposure apparatus to the NA of the projection optical system. Reference numeral 327 denotes a measurement coordinate ID corresponding to each measurement coordinate. Reference numerals 328 and 329 denote distortion measurement values corresponding to measurement point 1, 328 indicating an X measurement value and 329 indicating a Y measurement value. One set of measurement data specified by the apparatus measurement timing illumination mode is the data indicated by reference numeral 330. In this embodiment, there are data for nine points.

An example of the product information database 107 is shown in FIG. 4.

Reference numeral 401 denotes a product information table in which an alignment tree and exposure illumination mode are specified for each product. Reference numeral 402 denotes a product ID which uniquely identifies a product. This example shows product information for only one product. Reference numeral 403 denotes a process ID which uniquely identifies a process; and 404, a process sequence number (No.) indicating a sequence of an exposure process for constructing the product.

Reference numeral 405 denotes an alignment target layer indicating a process subjected to alignment. The semiconductor exposure apparatus 101 is required to perform accurate alignment and exposure for this alignment target layer. Reference numerals 406 and 407 denote illumination modes used in exposure, 406 indicating an NA and 407 indicating a Sigma thereof. Reference numerals 408 and 409 denote a permissible alignment error for the alignment target layer, 408 indicating a permissible error in the X direction and 409 indicating a permissible error in the Y direction.

A method of collecting distortion data is described. First described is a case of measuring distortion data by the semiconductor exposure apparatus 101.

Normally, in the case of measuring a distortion by the semiconductor exposure apparatus 101, a wafer on which a distortion pattern is exposed and developed is measured by an alignment measurement system of the semiconductor exposure apparatus 101.

Figure 5:
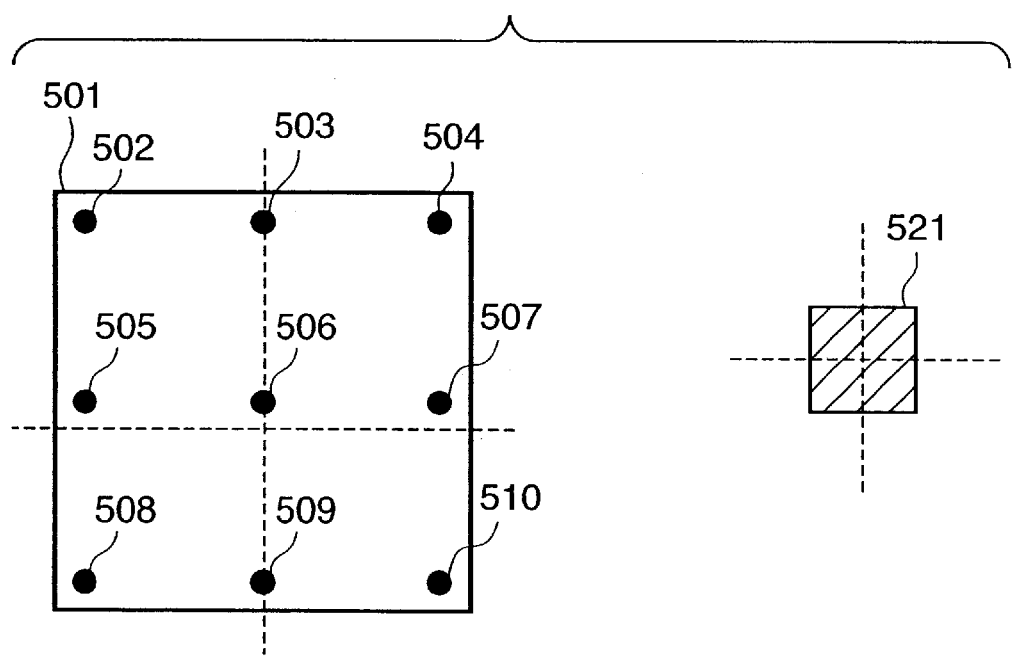
FIG. 5 is a schematic view showing distortion exposure (entire-surface exposure in one operation)

A method of exposing a distortion pattern is described. First, entire-surface exposure is performed in one operation as shown in FIG. 5. On the reticle used in this stage, a mark 521 is placed on the coordinates corresponding to each measurement point. Herein, to show an example using a positive resist, the hatched portion 521 indicates a light-shielding portion using chrome.

Figure 6:
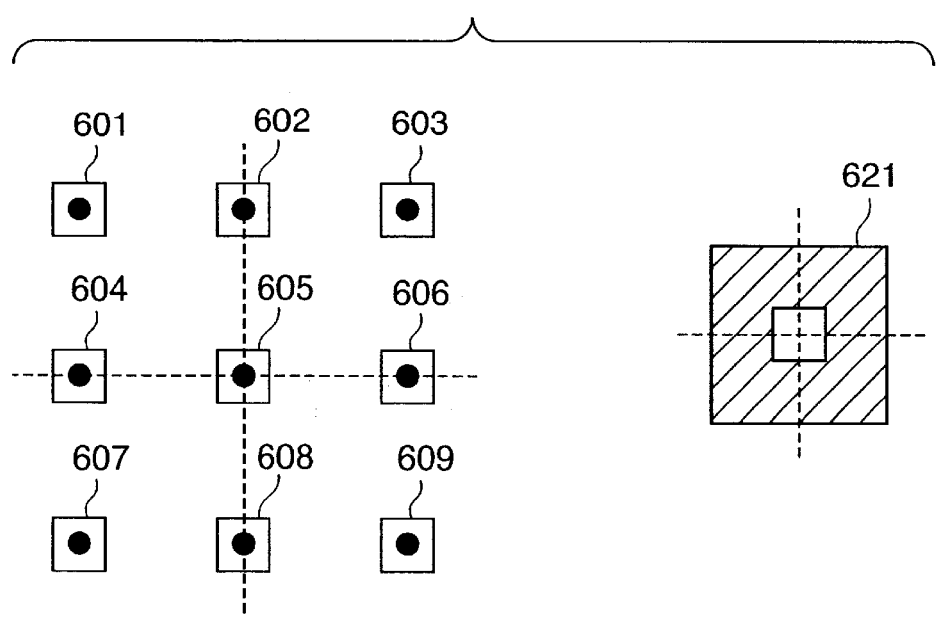
FIG. 6 is a schematic view showing distortion exposure (stage lattice exposure)

When the entire-surface exposure is performed in one operation, the mark 521 is projected to a position displaced by an amount of lens distortion and exposed on the wafer. On this wafer, a mark 621 is exposed with the stage as a reference in a manner such that the mark 621 overlaps each of the reference numerals 502 to 510 in FIG. 5, as indicate by reference numerals 601 to 609 in FIG. 6. Similar to the mark 521, since the mark 621 is also an example using a positive resist, the hatched portion indicates a light-shielding portion using chrome. The mark 621 used for exposing each shot of 601 to 609 is the same mark (same height of the image) on the reticle.

Figure 7:
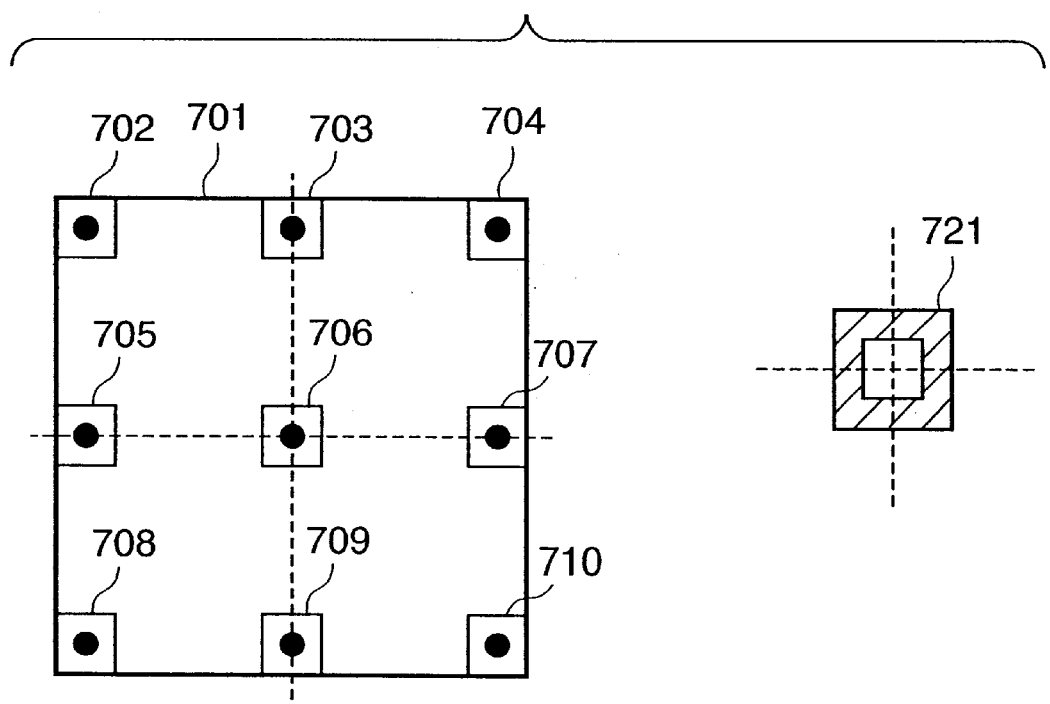
FIG. 7 is a schematic view showing distortion exposure (after overlay)

An image of a layout exposed in the above-described manner is shown in FIG. 7. Reference numeral 721 shows an image after developing each of the measurement points 702 to 710. The hatched portion of the mark image 721 indicates a portion where a resist remains. When a lens distortion exists, the mark image where a resist does not exist in the image 721 is displaced to either side of the peripheral mark where the resist remains. To measure a distortion, the displacement is measured at each point.

Figure 8:
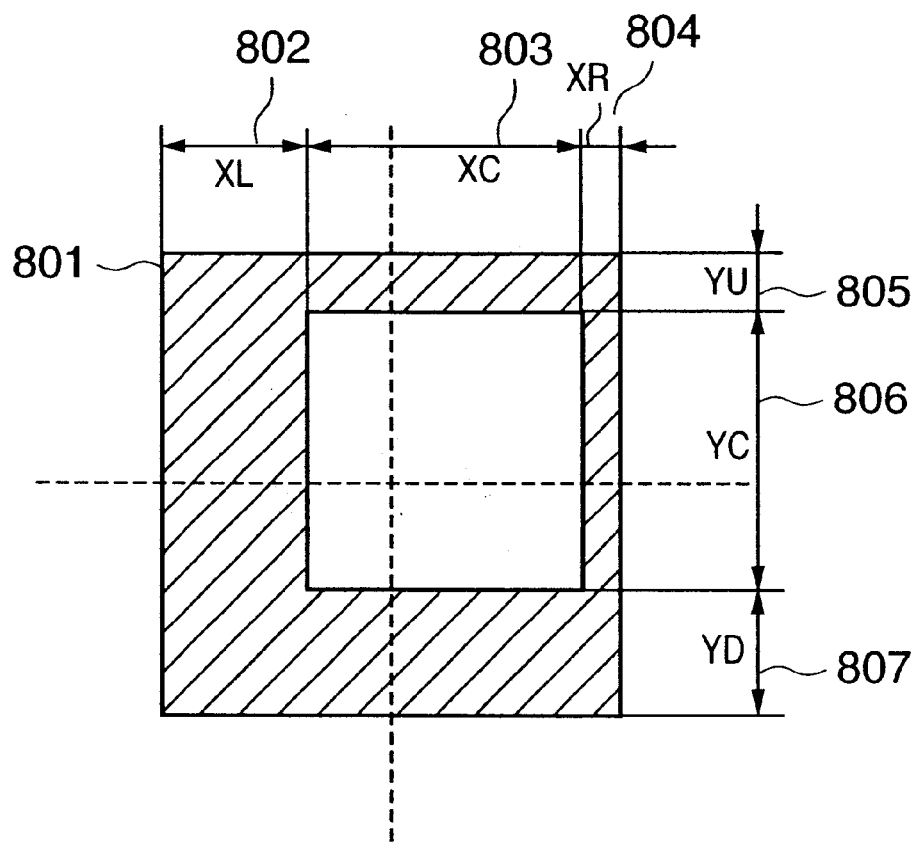
FIG. 8 is a schematic view showing a distortion measurement method.

When actual measurement is performed, each of the dimensions shown in FIG. 8 is measured and calculation is performed. Equations for calculating distortions in X and Y directions (Xdis and Ydis) are provided as follows:

$$Xdis=(XR-XL)/2$$

$$Ydis=(YU-YD)/2.$$

The measurement may be executed by utilizing a measurement function of the exposure apparatus, or a measurement function of an external measurement device.

Assuming that the measurement is executed by the exposure apparatus, distortion data of each point is measured by the control computer 103 in FIG. 1 and transmitted to the console computer 102. The console computer 102 transmits the distortion data to the database management system 105 through the network 112, then to the distortion management database 106 of the server 104. Note that the data transmitted herein needs to include all items of the distortion measurement data shown in the distortion measurement data table 321 in FIGS. 3A, 3B and 3C.

By virtue of the foregoing data transmission, distortion data is managed with dates in the form of a history for each apparatus and each exposure illumination mode. Distortion data acquisition is performed by the foregoing method.

Figure 9:
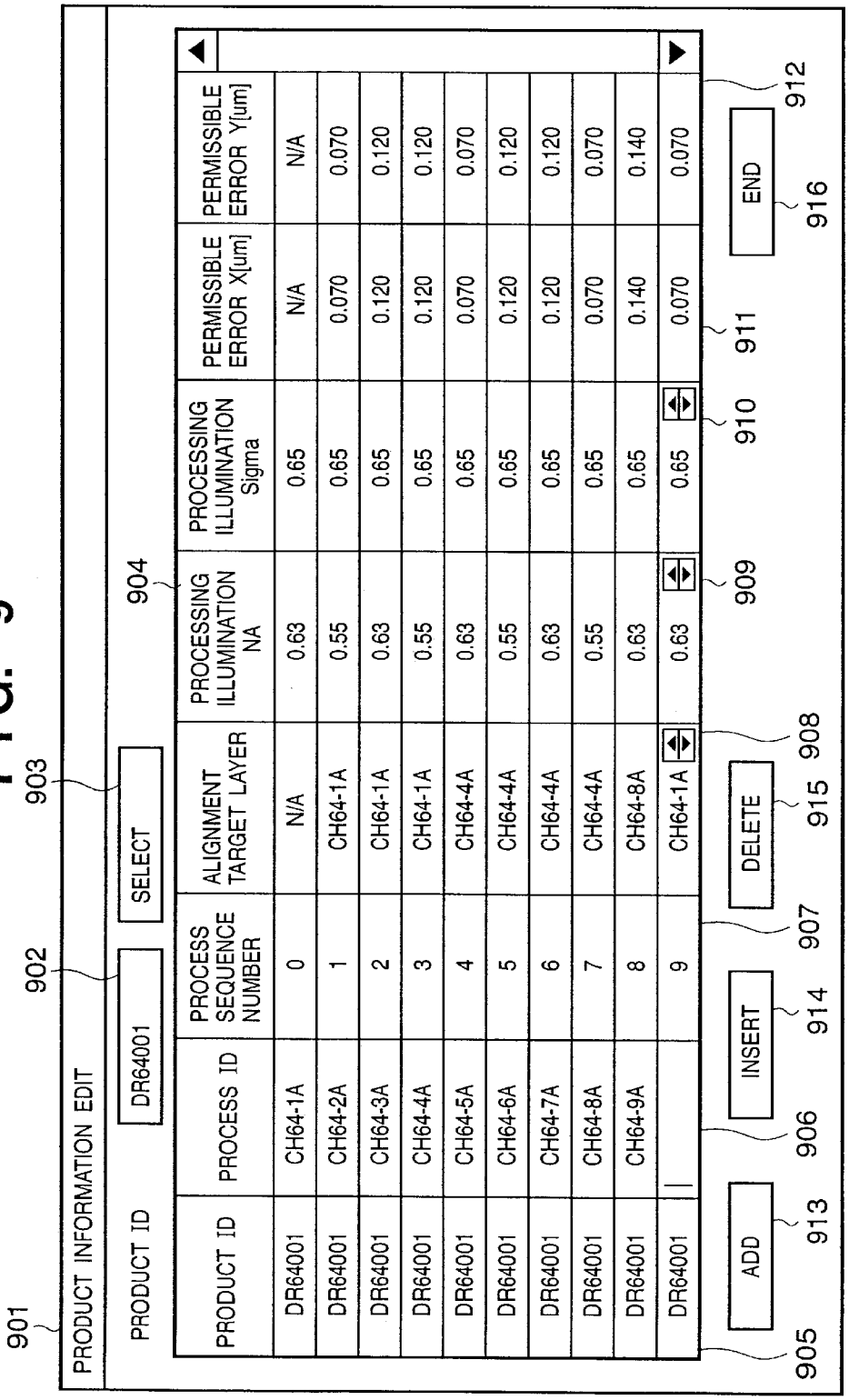
FIG. 9 is a schematic view showing a screen for inputting product information.

Product information setting is realized by a user who inputs data from the client 108. An example of an input screen is shown in FIG. 9.

An input operation is described below. When a product ID is inputted in a cell 902 and a select button 903 is depressed, a list of product information having the inputted product ID is displayed. In this state, one line of the frame 904 is selected an add button 913 or insert button 914 is depressed.

When the add button 913 is depressed, a new line is added after the selected line, enabling item input in 905 to 912. When the insert button 914 is depressed, a new line is inserted before the selected line, enabling item input in 905 to 912.

When a delete button 915 is depressed after a line is selected, the selected line is deleted. When the above operation is performed, the process sequence number in the item 907 is automatically renumbered. An end button 916 is provided to end the list displayed on the screen in FIG. 9, and reflect the contents of the setting in the product information database.

Data storage is performed in the foregoing manner.

Hereinafter, actual search processing is described.

First, a product name and process ID of a reference process is inputted from the client 108 of the semiconductor exposure apparatus management system. Herein, an example of a reference process input screen for inputting a product name and process ID is shown in FIG. 10.

Referring to FIG. 10, reference numeral 1001 denotes a reference process input screen; and 1002, a text input field for inputting a product ID. Although it is assumed herein that a keyboard is used for inputting data, a barcode reader, a magnetic card or the like, may be employed. Upon inputting a product ID in the text input field 1002, a select button 1003 is depressed to display a list display area 1004, which includes: a process ID list 1005 corresponding to the product ID inputted in the text input field 1002, a process sequence number list 1006 indicating a sequence of exposure in the process corresponding to the process ID, and an alignment target layer list 1007 indicating a corresponding alignment target process. Herein, a list cell of a process subjected to searching is selected and a search start button 1009 is depressed to start search processing. Furthermore, designation of whether or not to perform linear correction, designated by the radio button 1008, is used in the algorithm for alignment error comparison, which will be executed later. When the cancel button 1010 is depressed, the display of the screen 1001 ends.

Processing after the radio button 1008 is depressed is described with reference to the flowchart in FIGS. 11 and 12. Step numbers of the flowchart in FIGS. 11 and 12 are described in the parentheses and each processing of the step is described below.

Figure 12A:
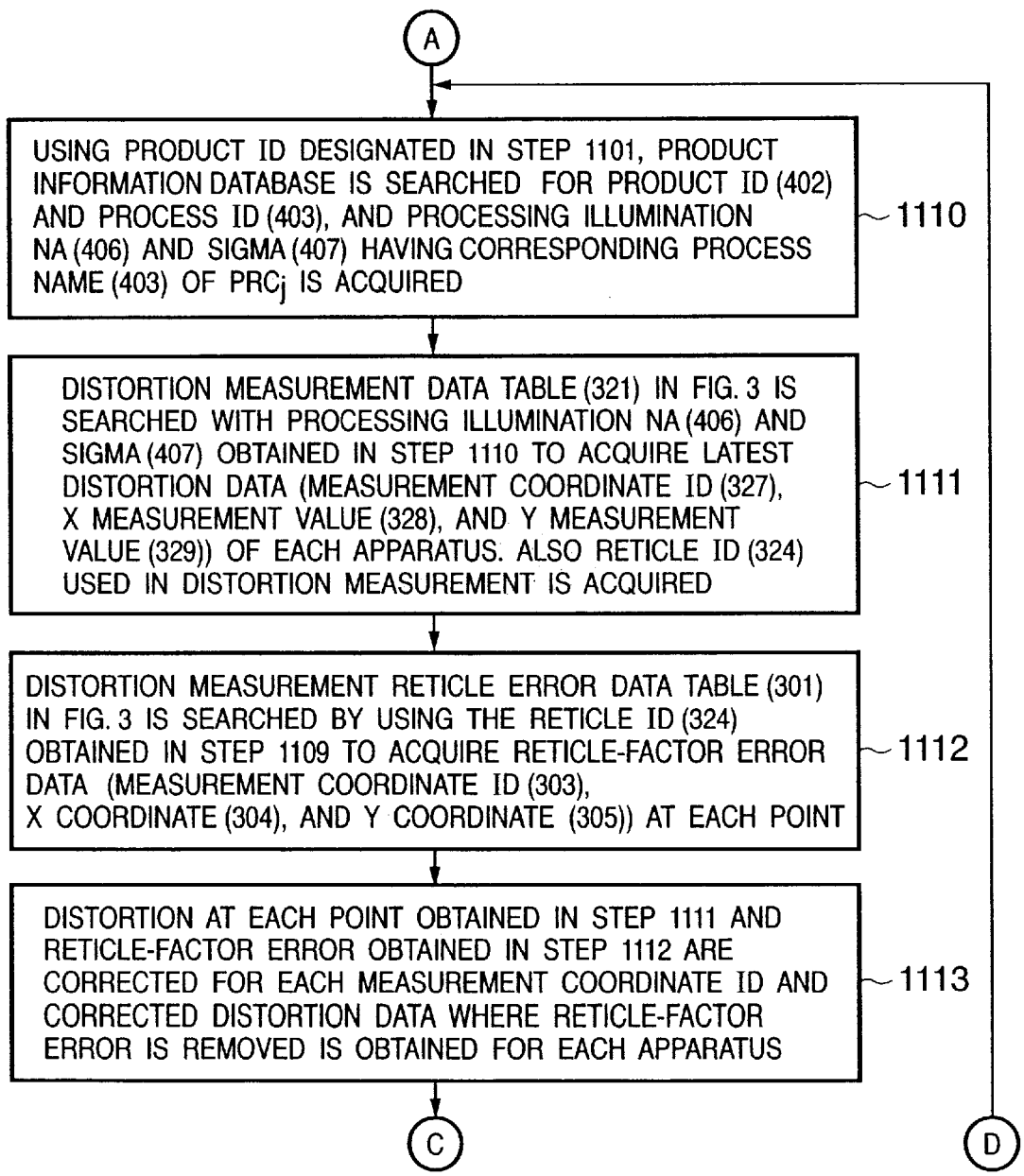
FIGS. 12A and 12B are flowcharts showing a semiconductor exposure apparatus management method subsequent to FIG. 11.
Figure 12B:
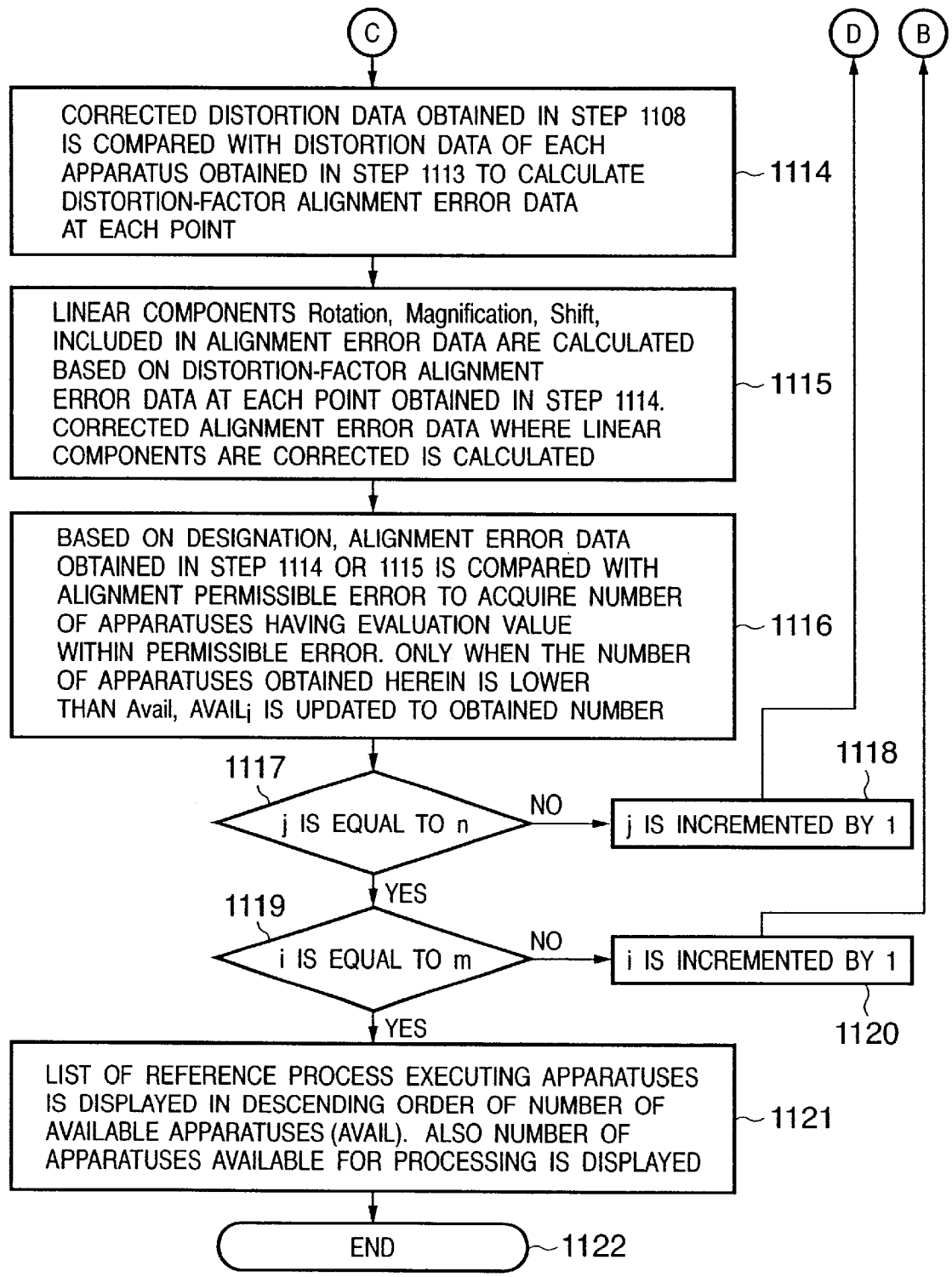

Note that processing shown in FIGS. 11 and 12 is executed by a CPU of the server 104. Furthermore, screen data, constituting an operation screen which is generated depending on the necessity for executing various processing of the present invention, which includes an operation screen shown in FIG. 15 that will be described later, is generated by the server 104. By transmitting the screen data to the client 108, an operation screen corresponding to the screen data is displayed on a display of the client 108.

Furthermore, the system may be arranged such that operation performed in the client 108 is executed by the server 104, and the screen data is displayed on a display of the server 104.
(Step 1102)

The product information database 107 shown in FIG. 4 is searched by using a product ID and a process ID inputted on the reference process input screen 1001 in step 1101. A process having a process ID of the alignment target layer (405), which matches the inputted value of the product ID (402) and process ID (403), is searched, and the process ID (403) of the process found is acquired.

In the example shown in FIG. 10, DR64001 and CH64-4A are designated as the product ID and process ID respectively. Therefore, process IDs having an alignment target layer that matches the designated process ID (CH64-4A) are CH64-5A, CH64-6A, CH 4-7A, and CH64-8A. The number (n) of search results in this case is four. The relation between the process name and registers $PRC_1$ to $PRC_4$ storing each process name is shown in the table 1.

Note that the number of registers PRC which are secured to store process IDs is N, and the N-th register is expressed as a register $PRC_N$.

TABLE I

Example of Target Processes

|  | $PRC_1$ | $PRC_2$ | $PRC_3$ | $PRC_4$ |
|---|---|---|---|---|
| PROCESS | CH64-5A | CH64-6A | CH64-7A | CH64-8A |

(Step 1103)

According to the product ID and process ID inputted in step 1101, product information database in FIG. 4 is searched to acquire the processing illumination NA (406) and processing illumination Sigma (407) indicative of an illumination mode.
(Step 1104)

A list of all semiconductor exposure apparatuses is acquired. The number of semiconductor exposure apparatuses is m. The names of the semiconductor exposure apparatuses are expressed by $M-ID_1$ to $M-ID_m$.
(Step 1105)

1 is inputted to a variable i for looping the processing executed by a reference process executing apparatus (server 104).
(Step 1106)

Distortion data (measurement coordinate ID (327), X measurement value (328), and Y measurement value (329)) having the latest measurement date (323) is searched based on the processing illumination NA (325) and processing illumination Sigma (326) of the reference process, which are acquired in step 1103 based on the exposure apparatus's ID $M-ID_i$ (322). At the same time, a reticle ID (324) used in distortion measurement is acquired.
(Step 1107)

Based on the reticle ID acquired in step 1106, the distortion measurement reticle error data table (301) is searched to acquire error data (measurement coordinate ID (303), X coordinate (304), and Y coordinate (305)) that is reticle-factor distortion data at each point.
(Step 1108)

Based on the distortion data (measurement value) at each point obtained in step 1106 and the reticle-factor error data at each point obtained in step 1107, the reticle-factor error component is removed from the distortion data (measurement value), thereby extracting a pure distortion component (corrected distortion data)

Figure 13:
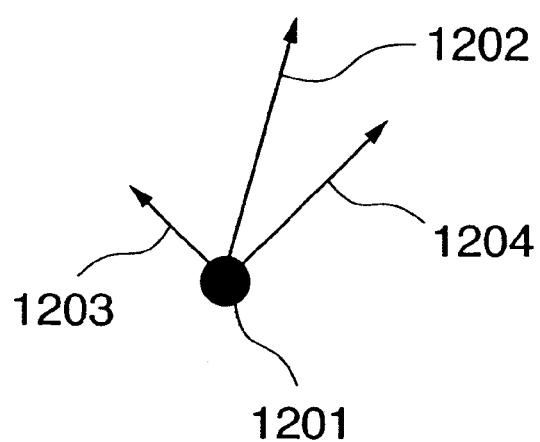
FIG. 13 is a schematic view for explaining correction of a reticle error.

The extraction method is a simple subtraction of vectors as shown in FIG. 13. Referring to FIG. 13, reference numeral 1201 denotes a measurement point; 1202, vector data of the distortion data (measurement value) obtained in step 1106; 1203, vector data of the reticle error component obtained in step 1107; and 1204, vector data of the distortion component on which the reticle error is corrected.

In this case, the vector data 1203 is simply subtracted from the vector data 1202 to obtain vector data 1204 representing a distortion component. This operation is repeated for each point (measurement coordinate ID) to perform correction.

Then, corrected distortion data acquisition processing for a processing illumination condition of the reference process ends for one prospective apparatus of the reference process.
(Step 1109)

1 is inputted to a variable j for looping the target process.

The number of target apparatuses (herein, m) is inputted to an evaluation value $AVAIL_i$ indicative of the number of available apparatuses for one reference process executing apparatus $M-ID_i$.
(Step 1110)

Using the product ID designated in step 1101, the product information database in FIG. 4 is searched for the product ID (402) and process ID (403). Then, processing illumination NA (406) and processing illumination Sigma (407) having the corresponding process name (403) in $PRC_j$ are acquired.
(Step 1111)

By referring to the distortion measurement data table (321) in FIGS. 3A, 3B and 3C for each apparatus ID (322), illumination NA (325) and illumination Sigma (326) that match the processing illumination NA (406) and processing illumination Sigma (423) obtained in step 1110 are searched, and distortion data (measurement coordinate ID (327), X measurement value (328), and Y measurement value (329)) of each apparatus $M-ID_1$ to $M-ID_m$ having the latest measurement date (323) is acquired. At the same time, a reticle ID (324) used in each measurement is acquired.
(Step 1112)

The distortion measurement reticle error data table (301) is searched for a reticle ID (302) corresponding to the reticle ID (324) of the latest distortion data of each apparatus obtained in step 1111. Then, reticle-factor error data (measurement coordinate ID (303), X coordinate (304), and Y coordinate (305)) at each point corresponding to the reticle ID (302) is acquired. This processing is repeated for the number (m) of apparatuses.
(Step 1113)

According to the calculation similar to that of step 1108, the latest corrected distortion data, on which reticle-factor error has been corrected, is obtained for each apparatus (number of apparatuses m) based on the distortion data (measurement value) at each point obtained in step 1111 and the reticle-factor error data at each point obtained in step 1112. Naturally, calculation is repeated for the number of apparatuses.
(Step 1114)

The corrected distortion data of the reference process executing apparatus $M-ID_i$ obtained in step 1108 is compared with the corrected distortion data of each apparatus in $Prc_j$ obtained in step 1113 to calculate distortion-factor alignment error data at each point.

Figure 14:
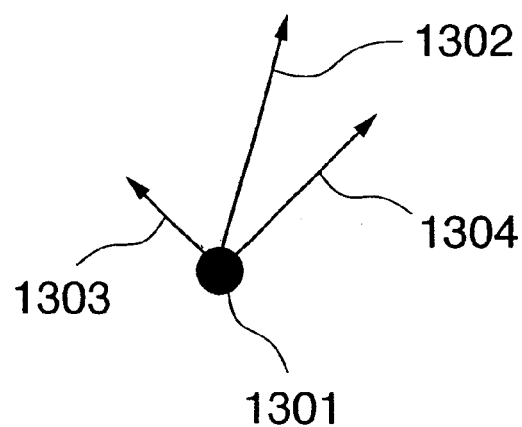
FIG. 14 is a schematic view for explaining calculation of an alignment error caused by a distortion.

The calculation method is a simple subtraction of vectors as shown in FIG. 14. Referring to FIG. 14, reference numeral 1301 denotes a measurement point; 1302, vector data of the corrected distortion data (measurement value) for the reference process executing apparatus M-ID$_i$ obtained in step 1111; 1303, vector data of the corrected distortion data (measurement value) of the target process Prc$_j$ obtained in step 1113; and 1304, vector data of a distortion-factor alignment error (alignment error data) when both distortions are combined.

In this case, the vector data 1303 is simply subtracted from the vector data 1302 to obtain vector data 1304 representing alignment error data. This operation is repeated for each point, and further repeated for each target apparatus (M-ID$_1$ to M-ID$_m$), thereby obtaining a distortion-factor alignment error for each semiconductor exposure apparatus. (Step 1115)

Linear components of the alignment error data are calculated based on the distortion-factor alignment error data at each measurement point obtained in step 1114. A method of determining each of the rotation correction value, chip magnification correction value, and shift correction value using the alignment error data is described below.

Define that the measurement coordinates X and Y corresponding to the measurement coordinate ID-1 are PosXi and PosYi, and corresponding measurement values are DataXi and DataYi (i=ID-1). The number of measurement coordinate points is n. The linear components included in the alignment error can be calculated by the following equation. It is based on a premise that the rotation component which is a target of a stepper in the semiconductor exposure apparatus 102 is small enough that $\sin\theta \approx \tan\theta$ stands.

$$x = \frac{1}{n}\sum_{i=0}^{n} PosXi \tag{1}$$

$$X = \frac{1}{n}\sum_{i=0}^{n} (PosXi)^2 \tag{2}$$

$$y = \frac{1}{n}\sum_{i=0}^{n} PosYi \tag{3}$$

$$Y = \frac{1}{n}\sum_{i=0}^{n} (PosYi)^2 \tag{4}$$

$$Z = \frac{1}{n}\sum_{i=0}^{n} (PosXi \times PosYi) \tag{5}$$

$$a = \frac{1}{n}\sum_{i=0}^{n} DataXi \tag{6}$$

$$b = \frac{1}{n}\sum_{i=0}^{n} DataYi \tag{7}$$

$$c = \frac{1}{n}\sum_{i=0}^{n} (DataXi \times PosXi) \tag{8}$$

$$d = \frac{1}{n}\sum_{i=0}^{n} (DataYi \times PosYi) \tag{9}$$

$$e = \frac{1}{n}\sum_{i=0}^{n} (DataYi \times PosXi) \tag{10}$$

$$f = \frac{1}{n}\sum_{i=0}^{n} (DataXi \times PosYi) \tag{11}$$

$$g = \frac{1}{n}\sum_{i=0}^{n} (DataXi)^2 \tag{12}$$

$$h = \frac{1}{n}\sum_{i=0}^{n} (DataYi)^2 \tag{13}$$

$$vx = X - x^2 \tag{14}$$

$$vy = Y - y^2 \tag{15}$$

$$vz = Z - x \times y \tag{16}$$

$$vp = y \times Z - x \times Y \tag{17}$$

$$vq = x \times Z - y \times X \tag{18}$$

If n>2

$$d0 = vx \times vy - vz^2 \tag{19}$$

$$dx2 = c \times vy + f \times vz + a \times vp \tag{20}$$

$$dy2 = d \times vx - e \times vz + b \times vq \tag{21}$$

$$dx3 = e \times vy - d \times vz + b \times vp \tag{22}$$

$$dy3 = f \times vx + c \times vz - a \times vq \tag{23}$$

If n=2

$$d0 = vx + vy \tag{24}$$

$$dx2 = dy2 = -a \times x - b \times y + c + d \tag{25}$$

$$dx3 = dy3 = -b \times x - a \times y + e + f \tag{26}$$

If n=1

$$d0 = 1.0 \tag{27}$$

$$dx2 = dy2 = dx3 = dy3 = 0.0 \tag{28}$$

If n=0

$$d0 = 1.0 \tag{29}$$

$$dx2 = dy2 = dx3 = dy3 = 0.0 \tag{30}$$

Values to be obtained are:

$$MagX = \frac{dx2}{d0} \tag{31}$$

$$MagY = \frac{dx2}{d0} \tag{32}$$

$$RotX = \frac{dx3}{d0} \tag{33}$$

$$RotY = -\frac{dy3}{d0} \tag{34}$$

$$ShiftX = a - x \times MagX + y \times RotY \tag{35}$$

$$ShiftY = b - x \times RotX - y \times MagY \tag{36}$$

The linear components to be obtained are MagX, MagY, RotX, RotY, ShiftX, and ShiftY in equations (31) to (36), respectively representing the chip magnification X, chip magnification Y, chip rotation X, chip rotation Y, shift X and shift Y. In a case wherein a normal step-and-repeat type stepper is employed, it serves no purpose to process each of the X and Y components of the chip magnification and chip rotation. Therefore, an average value of X and Y may be used.

The distortion-factor alignment error at each measurement point is corrected by using each of the linear components obtained herein.

The correction calculation is realized by the following equations. Since the values calculated by the above equations (31) to (36) are linear components of an alignment error, the sign of the values needs to be reversed when inputted to the following equation. Each correction value is obtained as Mx, My, Rx, Ry, Sx, and Sy.

$$Mx=-MagX \quad (37)$$

$$My=-MagY \quad (38)$$

$$Rx=-RotX \quad (39)$$

$$Ry=-RotY \quad (40)$$

$$Sx=-ShiftX \quad (41)$$

$$Sy=-ShiftX \quad (42)$$

The corrected distortion-factor alignment error DataXi' and DataYi' can be calculated by the following equations.

$$DataXi'=DataXi-Ry \times PosY + Mx \times PosX + Sx \quad (43)$$

$$DataYi'=DataYi+Rx \times PosX + My \times PosY + Sy \quad (44)$$

(Step 1116)

According to a designation of the radio button 1008 in FIG. 10, either the alignment error data obtained in step 1114 or corrected alignment error data after linear correction obtained in step 1115 is adopted. The adopted alignment error herein is an alignment error at each distortion measurement point. A measurement value of the measurement point having a maximum alignment error for X and Y is adopted as the alignment error evaluation value of each apparatus (M-ID).

The evaluation value is compared respectively with the permissible errors X (408) and Y (409) corresponding to the product ID (402) in FIG. 4. The apparatus having an evaluation value within the permissible errors X and Y is determined as an available apparatus, and the number of available apparatuses is counted as the available apparatuses for the target process $Prc_j$.

If the number of available apparatuses for the target process $Prc_j$ is smaller than the evaluation value of the reference process executing apparatus, the new value is inputted to the number of available apparatuses $AVAIL_j$.

(Step 1117)

It is determined whether or not the loop has been executed for the number of target processes. It is determined whether or not the loop variable j is equal to the number n of target processes. When j is not equal to n, the control proceeds to step 1118. When j is equal to n, the control proceeds to step 1119.

(Step 1118)

To execute the loop for the next target process, j is incremented by 1 and the control returns to step 1110.

(Step 1119)

It is determined whether or not the loop has been executed for the number of the reference process executing apparatuses. It is determined whether or not the loop variable i is equal to the number m of the reference process executing apparatuses (all apparatuses). When i is not equal to m, the control proceeds to step 1120. When i is equal to m, the control proceeds to step 1121.

(Step 1120)

To execute the loop for the next reference process executing apparatus, i is incremented by 1 and the control returns to step 1106.

(Step 1121)

When the aforementioned two loops end, evaluation values corresponding to the prospective apparatuses $M\text{-}ID_1$ to $M\text{-}ID_m$ for executing the reference process are stored in $AVAIL_1$ to $AVAIL_m$.

In a case wherein an apparatus $M\text{-}ID_x$ is used for executing the referennce process, among a plurality of processes whose reference process is the alignment target process, $AVIL_x$ represents the number of available apparatuses in a process having the smallest number of available apparatuses. The larger the value of $AVAIL_x$, the more flexible the subsequent apparatus operation. Herein, a list of reference process executing apparatuse is shown in order of $AVAIL_x$.

FIG. 15 is display example of a list of reference process executing apparatuses. Reference numeral 1402 denotes a target product ID; 1403, a process ID of a reference process; and 1404, a correction mode, indicating whether or not linear correction has been executed when distortion is compared. In the list 1405, apparatuses used in the process corresponding to the process ID 1403 are listed in descending order of flexibility in apparatus operation in the post process. Reference numeral 1406 denotes a determination order; and 1407, an apparatus ID corresponding to the determined order. The evaluation value 1408 indicates the number of available apparatuses under the severest apparatus operation condition in the post process in a case wherein the apparatus corresponding to the apparatus ID 1407 is used in the reference process. Herein, the number of apparatuses is listed in descending order. When the close button 1401 is depressed, the reference process executing apparatus list 1401 is closed.

As has been described above, according to the present embodiment, semiconductor exposure apparatuses 101 are managed such that a combination of semiconductor exposure apparatuses 101 which automatically perform the most appropriate exposure is selected in accordance with each distortion caused by various conditions of the semiconductor exposure apparatuses 101. By virtue of this, it is possible to provide a management system and management method of semiconductor exposure apparatuses, which can efficiently reduce a distortion-factor alignment error without increasing the number of processes and perform reliable exposure.

The present invention includes a case wherein program codes of software for realizing functions of the above embodiment are supplied to an apparatus connected to the above-described various devices or a computer in the system, and the program codes are executed by operating the various devices in accordance with the program stored in the system or a computer (CPU or MPU) of the apparatus to realize the above-described functions of the embodiment.

In this case, the program codes of the software realize the above-described functions of the embodiment, and program codes themselves as well as means for supplying the program codes to the computer, e.g., a storage medium storing the program codes, constitute the present invention. The storage medium, such as a flexible disk, a hard disk, an optical disk, a magneto-optical disk, CD-ROM, a magnetic tape, a non-volatile type memory card, ROM, and so on can be used for storing the program codes.

Furthermore, besides the aforesaid functions according to the above embodiments being realized by executing the program codes which are supplied to a computer, the present invention includes the program codes in a case wherein the program codes are executed by an OS (operating system) or the like working on the computer and the functions according to the above embodiment are realized jointly with or without other application software.

Furthermore, the present invention also includes a case wherein, after the supplied program codes are written in a function expansion card which is inserted into the computer or in a memory provided in a function expansion unit which is connected to the computer, a CPU or the like contained in the function expansion card or unit performs a part or the entire process in accordance with designation of the program codes and realizes functions of the above embodiment.

As many apparently widely different embodiments of the present invention can be made without departing from the spirit and scope thereof, it is to be understood that the invention is not limited to the specific embodiments thereof except as defined in the claims.

What is claimed is:

1. A management system for a plurality of semiconductor exposure apparatuses, and for controlling each exposure when a semiconductor device is manufactured, said system comprising:

first means for managing distortion data of each illumination condition for each of the semiconductor exposure apparatuses;

second means for designating a product and a process comprising a reference process;

third means for acquiring an illumination condition of the product and process designated by said second means;

fourth means for acquiring a process to be searched as a reference process including the process designated by said second means;

fifth means for acquiring an illumination condition of the process to be searched acquired by said fourth means;

sixth means for acquiring distortion data of an illumination data of the process designated by said second means for each of the semiconductor exposure apparatuses;

seventh means for acquiring distortion data of the illumination condition acquired by said fifth means corresponding to the process to be searched acquired by said fifth means for each of the semiconductor exposure apparatuses;

eighth means for acquiring a permissible value of an alignment error caused by distortion of the process to be searched acquired by said fourth means;

ninth means for comparing the distortion data acquired by said sixth means with the distortion data acquired by said seventh means, and for calculating an alignment error caused by distortion of a combination of the semiconductor exposure apparatuses;

tenth means for comparing the alignment error calculated by said ninth means with the permissible value acquired by said eighth means; and eleventh means for displaying an evaluation value of a semiconductor exposure apparatus used for the reference process on the basis of the number of said semiconductor exposure apparatuses whose alignment error is within a predetermined permissible error, which is obtained by a comparison result of said tenth means.

2. The system according to claim 1, wherein distortion data of said semiconductor exposure apparatus is acquired automatically via a network or online when distortion of a semiconductor exposure apparatus is measured by a measurement function thereof.

3. The system according to claim 1, further comprising twelfth means for calculating linear components, of which an alignment error is calculated by said tenth means, to correct said linear components, and for being difference components after the correction as a determination reference.

4. The system according to claim 1, wherein X and Y indicating error components at each of the measurement points from each ideal projection point are used as distortion data managed by said first means.

5. The system according to claim 1, wherein said first means, in distortion management, has a function managing a name of a reticle used for distortion exposure and a function managing errors of each of reticles used for distortion measurement, and said tenth means has a function correcting an error of a reticle used for distortion measurement.

6. A management system for a plurality of semiconductor exposure apparatuses, and for controlling each exposure apparatus when a semiconductor device is manufactured, said system comprising:

determining means for determining, in a plurality of exposure, a combination of said plurality of semiconductor exposure apparatuses being the most appropriate for exposure, for each of the exposures, on the basis of distortion of the semiconductor exposure apparatuses.

7. The system according to claim 6, wherein the distortion is managed for every illumination condition for each of the semiconductor exposure apparatuses, and said determining means determines the combination of the plurality of semiconductor exposure apparatuses being the most appropriate for exposure, for each of the exposures, on the basis of a difference of the distortion.

8. A management method of a semiconductor exposure system for a plurality of semiconductor exposure apparatuses, and for controlling each exposure when a semiconductor device is manufactured, said method comprising:

a first step of managing distortion data of each illumination condition for each of the semiconductor exposure apparatuses;

a second step of designating a product and a process comprising a reference process;

a third step of acquiring an illumination condition of the product and process designated in said second step;

a fourth step of acquiring a process to be searched as a reference process including the process designated in said second step;

a fifth step of acquiring an illumination condition of the process to be searched acquired in said fourth step;

a sixth step of acquiring distortion data of illumination data of the process designated in said second step for each of the semiconductor exposure apparatuses;

a seventh step of acquiring distortion data of the illumination condition acquired in said fifth step corresponding to the process to be searched, acquired in said fifth step;

an eighth step of acquiring a permissible value of an alignment error caused by distortion of the process to be searched, acquired in said fourth step;

a ninth step of comparing the distortion data acquired in said sixth step with the distortion data acquired in said seventh step and for calculating an alignment error caused by distortion of a combination of the semiconductor exposure apparatuses;

a tenth step of comparing the alignment error calculated in said ninth step with the permissible value acquired in said eighth step; and an eleventh step of displaying an evaluation value of a semiconductor exposure apparatus used for the reference process on the basis of the number of the semiconductor exposure apparatuses whose alignment error is within a predetermined permissible error, which is obtained by a comparison result in said tenth step.

9. The method according to claim 8, further comprising acquiring distortion data of the semiconductor exposure apparatus automatically via a network or online when distortion of a semiconductor exposure apparatus is measured by a measurement function thereof.

10. The method according to claim 8, further comprising a twelfth step of calculating linear components, of which an alignment error is calculated in said tenth step, to correct the linear components, and for being difference components after the correction as a determination reference.

11. The method according to claim 8, where X and Y indicating error components at each of the measurement points from each ideal projection point are used as distortion data managed in said first step.

12. The method according to claim 8, wherein said first step, in distortion management, manages a name of a reticle used for distortion exposure and manages errors of each of the reticles used for distortion measurement, and said tenth step corrects an error of a reticle used for distortion measurement.

13. A computer-readable recording medium storing a program for causing a computer to execute each of the steps in a management method defined by claim 8.

* * * * *

UNITED STATES PATENT AND TRADEMARK OFFICE
CERTIFICATE OF CORRECTION

PATENT NO. : 6,801,825 B2
DATED : October 5, 2004
INVENTOR(S) : Norihiko Utsunomiya It is certified that error appears in the above-identified patent and that said Letters Patent is hereby corrected as shown below:

Column 1,
Line 51, "expos re" should read -- exposure --.
Line 56, "apparatuse" should read -- apparatuses; --.

Column 5,
Line 35, "indicate" should read -- indicated --.

Column 6,
Line 16, "selected an" should read -- selected and an --.

Column 8,
Line 3, "data)" should read -- data). --.

Column 11,
Line 23, "$Sx$=-$ShiftX$" should read -- $Sy$=-$ShiftY$ --.

Column 12,
Line 15, "$AVIL_x$" should read -- $AVAIL_x$ --.
Line 19, "apparatuse" should read -- apparatuses --.

Column 14,
Line 25, "exposure," should read -- exposures, --.

Signed and Sealed this

Eleventh Day of January, 2005

JON W. DUDAS
*Director of the United States Patent and Trademark Office*